United States Patent [19]
Peng

[11] Patent Number: 5,955,866
[45] Date of Patent: Sep. 21, 1999

[54] CAR BATTERY CHARGER/TESTER

[76] Inventor: Jen-Chih Peng, 573-6 Chinhua Rd., Taichung, Taiwan

[21] Appl. No.: 09/122,597

[22] Filed: Jul. 27, 1998

[51] Int. Cl.⁶ .......................... H02J 7/00; G01N 27/416; G01R 27/08; G08B 21/00
[52] U.S. Cl. .......................... 320/105; 324/429; 324/772; 340/636
[58] Field of Search .................... 380/103, 104, 380/105, 112; 324/429, 426, 433, 772; 340/636

[56] References Cited

U.S. PATENT DOCUMENTS

| | | | |
|---|---|---|---|
| 3,936,744 | 2/1976 | Perlmutter | 324/772 |
| 5,214,368 | 5/1993 | Wells | 320/105 |
| 5,426,371 | 6/1995 | Salley et al. | 324/429 |
| 5,589,292 | 12/1996 | Rozon | 429/170 |
| 5,793,185 | 8/1998 | Prelec et al. | 320/104 |

*Primary Examiner*—Peter S. Wong
*Assistant Examiner*—Gregory J. Toatley
*Attorney, Agent, or Firm*—Connolly Buse Lodge & Hutz LLP

[57] ABSTRACT

A car battery charger/tester comprises a casing, an integrated circuit board, an accumulator, two test terminals, a test tip, and an indicator light array for displaying a battery loading state. When a car breaks down, car battery charger/tester allows to recharge the battery of the car and to test the battery and the generator of the car separately so as to prevent a second breakdown.

5 Claims, 3 Drawing Sheets

CAR BATTERY CHARGER/TESTER

BACKGROUND OF THE INVENTION

1. Field of the Invention

The present invention relates to a car battery charger/tester, particularly to a car battery charger/tester, which conveniently combines an integrated circuit board, an accumulator, a pair of test terminals and a test tip in a box for conducting a first test in a car that has broken down.

2. Description of Related Art

When a car is unable to be started, it usually arises from either the battery or the generator failure. Normally one of the following is done:

1. The battery of another car or an external battery are connected.

2. If the generator does not work, the car is towed to a repair shop.

In this situation, a mechanic needs a test meter, an accumulator and connecting cables for a first test. So a lot of components have to be kept ready, which is not convenient.

SUMMARY OF THE INVENTION

It is therefore the main object of the present invention to provide a car battery charger/tester, which combines in a single box the functions of charging a battery and testing battery and generator.

Another object of the present invention to provide a car battery charger/tester, which works as an emergency light for households in case of power failure.

The present invention can be more fully understood by reference to the following description and accompanying drawings.

DETAILED DESCRIPTION OF THE PREFERRED EMBODIMENT

Figure 1:
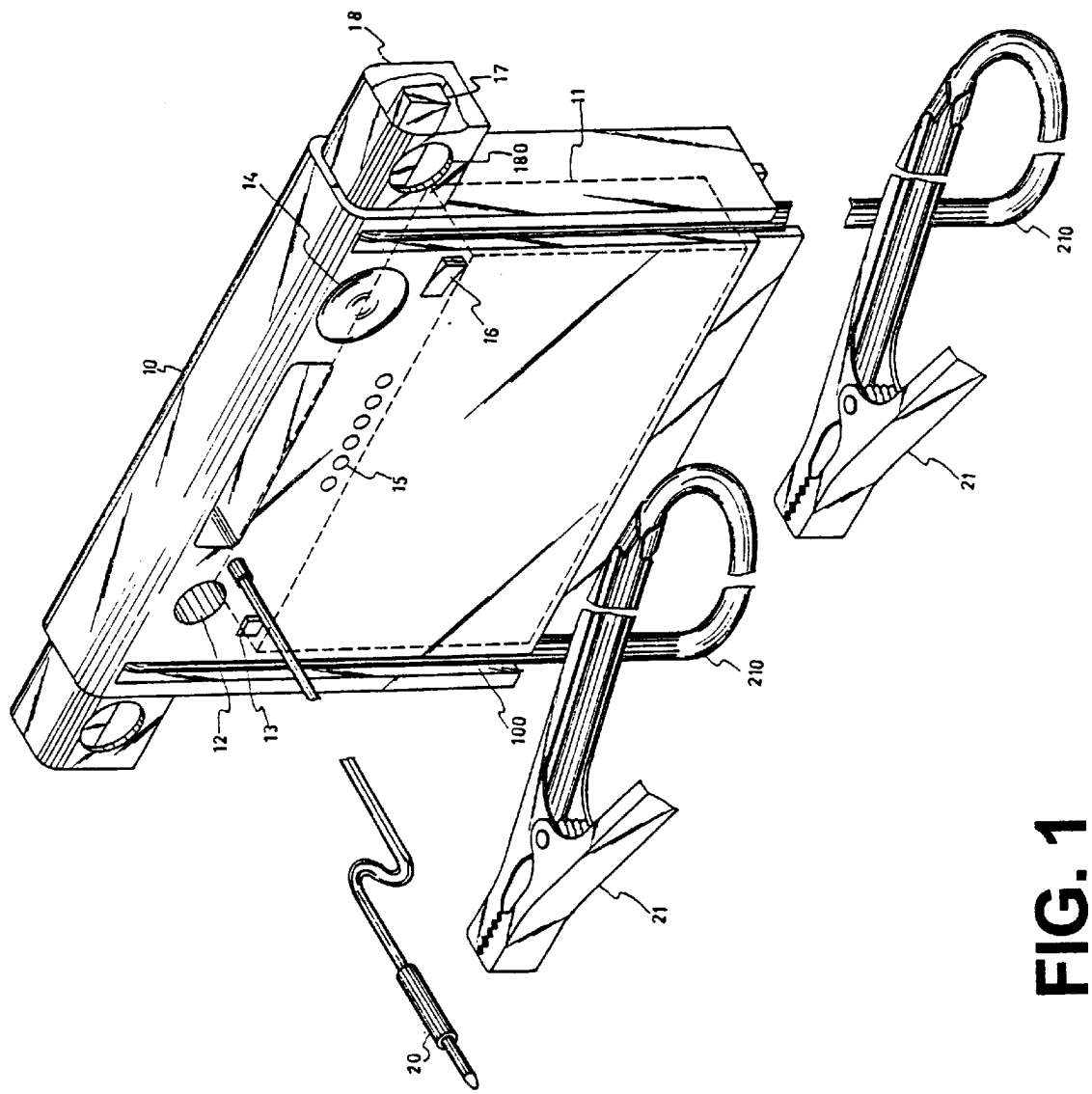
FIG. 1 is a perspective view of the car battery charger/tester of the present invention.

As shown in FIG. 1, the car battery charger/tester of the present invention has a casing 10, housing an accumulator 11 and an integrated circuit board (not shown). The casing 10 has an upper side with a charge/discharge socket 12 and a test switch 13. The charge/discharge socket 12 electrically connects to the accumulator 11 for charging or discharging thereof. The test switch 13 electrically connects to the accumulator 11 and a voltage comparator on the integrated circuit board. An indicator light array 15 is mounted on the casing 10 and electrically connects to the voltage comparator. When the test switch 13 is pressed, the voltage comparator can be activated and has an output to drive the indicator light array 15 so as to display the loading state of the accumulator 11 by means of the number of lights turned on. A lamp 14 with a switch 16 is further mounted on the casing 10 and electrically connects to the accumulator 11. The lamp 14 serves as a light source for repairs at night and can be turned on and off by operating the switch 16. In addition, the lamp 14 connects to a control circuit on the integrated circuit board. While the accumulator 11 is charged by an AC power source, the lamp 14 can be switched on by the control circuit in case of power failure. The casing 10 has two lateral sides, with a groove 100 cut into the casing 10 close to each of the two lateral sides. The grooves 100 hold positive and negative test terminals 21, which connect to the positive and negative terminals of the accumulator 11, respectively, via cables 210. A positioning bar 17 runs outwards from each of the two lateral sides respectively at the upper part thereof and is covered by a protective cover 18. The positioning bars 17 are clamped by the test terminals 21 with the protective covers 18 preventing unintended electrical contact when they are not in use. A through hole 180 is bored into each of the protective covers 18 for checking if the test terminals 21 stably clamping the positioning bars 17 or not. A test tip 20 is nearby the charge/discharge socket 12 and electrically connects to the test switch 13. The test tip 20 and the test terminals 21 are used to test the battery of a car.

For using the car battery charger/tester of the present invention, first the test switch 13 is pressed to connect the indicator light array 15 to the accumulator 11 for testing the loading state thereof by means of the number of lights of the indicator light array 15 illuminated. Then, the negative test terminal 21 is connected to the negative terminal of the battery of the car, and the test tip 20 is held against the positive terminal of the battery of the car. The number of lights of the indicator light array 15 illuminated displays the loading state of the battery of the car. If the car cannot be started, so far there is no way to know whether the battery or the generator of the car has failed. Therefore the positive test terminal 21 is connected to the positive terminal of the battery of the car, the car is started, and the positive test terminal 21 is removed again. The test tip 20 is held against the positive terminal of the battery of the car once again. The indicator light array 15 shows whether the generator has charged the battery or not. From this it can be told whether the battery or the generator of the car has failed.

In the dark, the lamp 14 is turned on for illumination by operating the switch 16.

Figure 2:
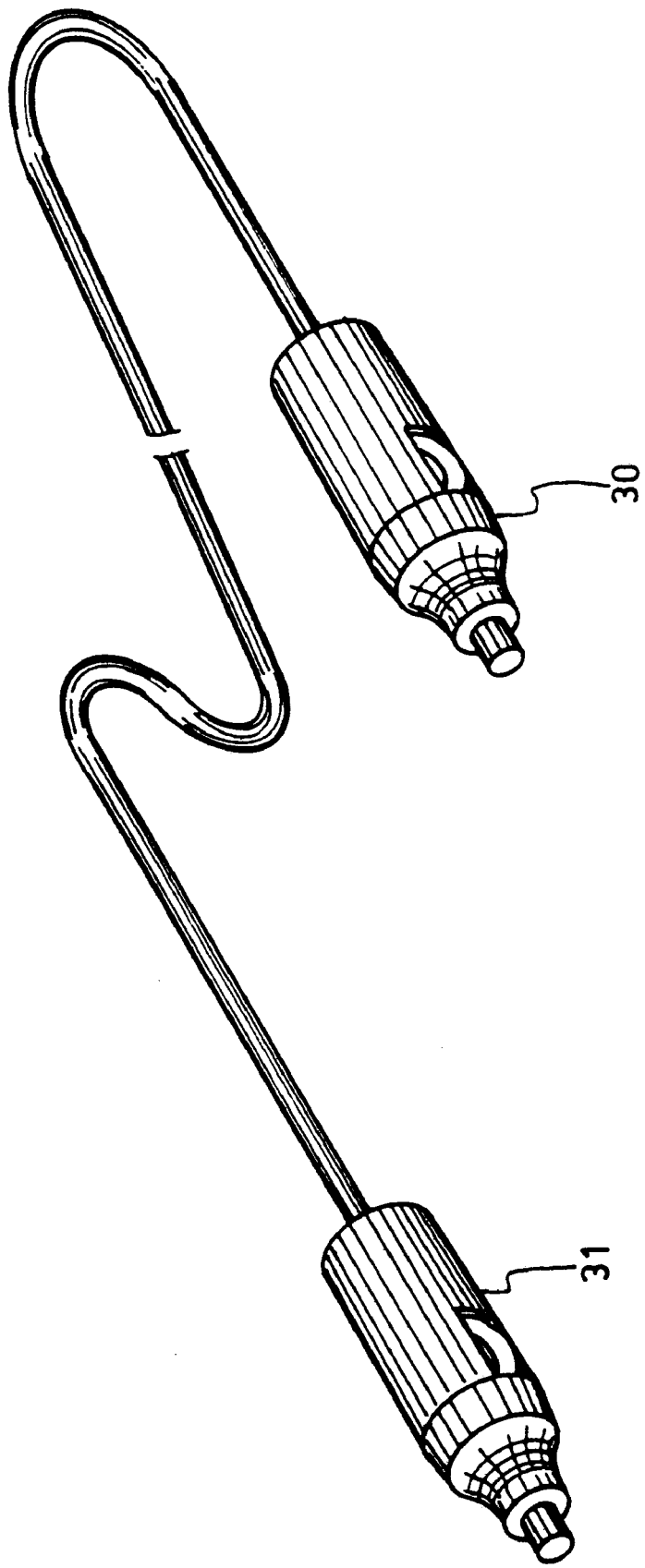
FIG. 2 is a schematic illustration of the charge/discharge cable of the present invention.

Referring to FIG. 2, the present invention further comprises a charge/discharge cable with connectors 30, 31. When the generator of the car proves unable to charge the battery of the car, the connectors 30, 31 are respectively plugged into the charge/discharge socket 12 and the cigar lighter of the car. Thus the car is provided with electricity for reaching a repair shop. In the contrary case that battery and generator of the car work normally, but the accumulator 11 is discharged, the accumulator 11 is recharged by plugging the connectors 30, 31 into the charge/discharge socket 12 and the cigar lighter of the car, respectively.

Figure 3:
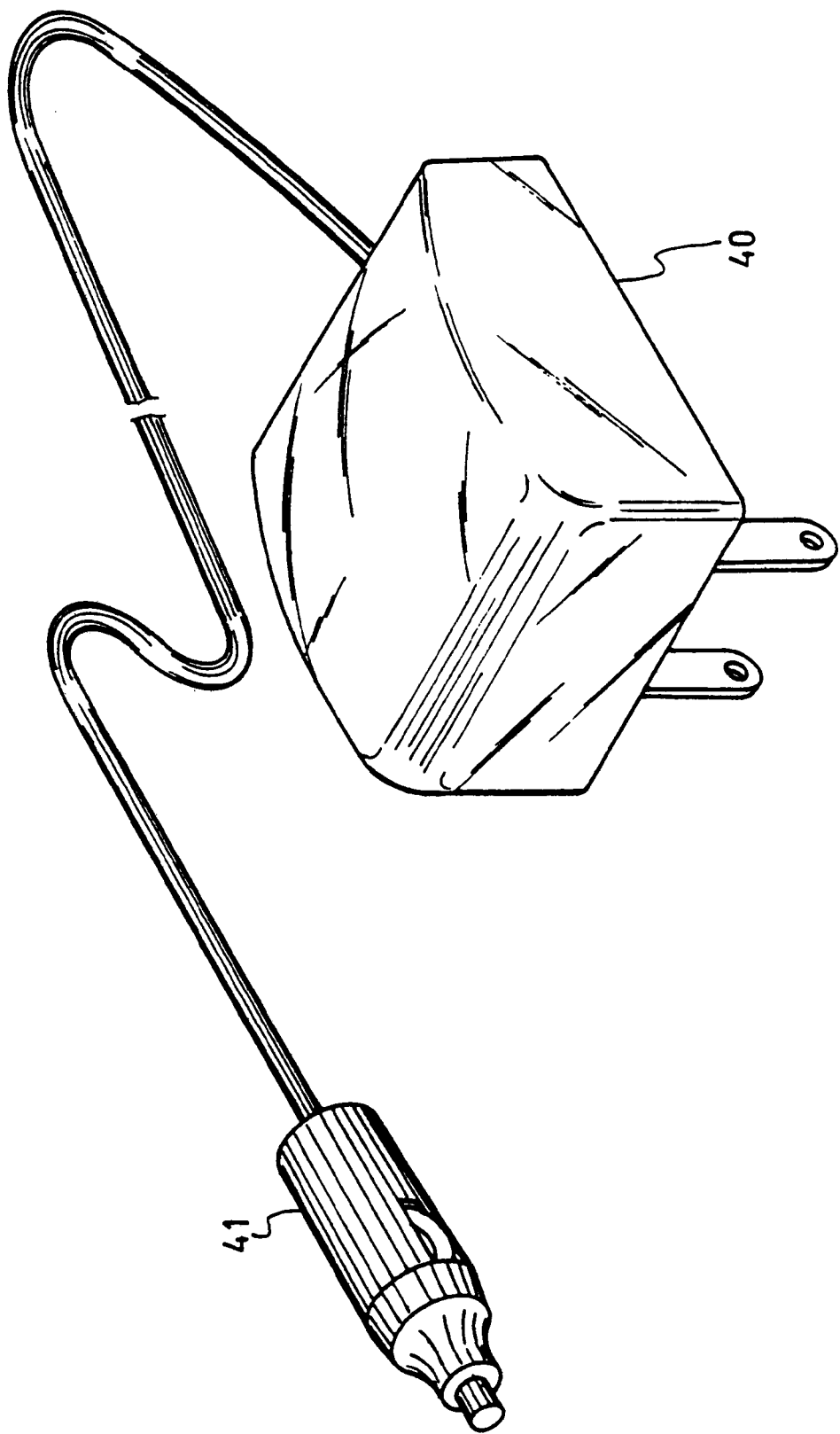
FIG. 3 is a schematic illustration of the recharge cable of the present invention.

Referring to FIG. 3, the present invention further comprises a recharge cable with an AC adapter 40 and a connector 41. When the accumulator 11 is charged, the connector 41 is plugged into the charge/discharge socket 12, and the AC adapter 40 is connected to the power line. With this connection installed, in case of a power failure the lamp 14 will be switched on by the control circuit on the integrated circuit board.

While the invention has been described with reference to a preferred embodiment thereof, it is to be understood that modifications or variations may be easily made without departing from the spirit of this invention which is defined by the appended claims.

I claim:

1. A car battery charger/tester, comprising:

a casing, having a groove at two lateral sides thereof and having a positioning bar extending outward from said two lateral sides at the upper part thereof, respectively;

an integrated circuit board mounted inside said casing, further comprising a control circuit and a voltage comparator;

an accumulator mounted inside said casing;

a charge/discharge socket, provided on said casing and electrically connecting to said accumulator for charging/discharging said accumulator;

a test switch, provided on said casing and electrically connecting to said accumulator and said voltage comparator;

an indicator light array, mounted on said casing and electrically connecting to said voltage comparator;

a lamp with a switch, mounted on said casing and electrically connecting to said accumulator;

two test terminals, each of which having a cable being laid into each of said grooves and electrically connecting to said accumulator; and a test tip, attaching to said casing and electrically connecting to said test switch;

whereby, when said test switch is pressed to on position, said voltage comparator can be activated to drive said indicator light array so as to display a loading state of said accumulator by means of the number of lights thereof turned on; when one of said test terminals is connected to one terminal of the battery in a car and said test tip is held against the other terminal of said battery, the number of lights of said indicator light array illuminated displays the loading state of said battery; and when the car cannot be started, the other test terminal is connected to the other terminal of said battery; while the car is started, the other test terminal is removed and said test tip is held against the other terminal of said terminal once again, and said indicator light array shows whether the generator has charged the battery or not.

2. A car battery charger/tester according to claim 1, wherein each of said positional bars is covered by a protective cover and said protective cover has a through hole for sight.

3. A car battery charger/tester according to claim 1, wherein said charge/discharge socket can be plugged by one connector of a charge/discharge cable with connectors at both ends thereof and the other connector is plugged into a cigar lighter of the car for charging or discharging said accumulator.

4. A car battery charger/tester according to claim 1, wherein said charge/discharge socket can be plugged by a connector of a AC adapter to charge said accumulator.

5. A car battery charger/tester according to claim 1, wherein in case of a power failure during charging said accumulator, said lamp is switched on by said control circuit.

* * * * *